United States Patent
Uemura

(10) Patent No.: US 8,203,173 B2
(45) Date of Patent: Jun. 19, 2012

(54) SEMICONDUCTOR INTEGRATED CIRCUIT

(75) Inventor: Toshifumi Uemura, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 229 days.

(21) Appl. No.: 12/458,276

(22) Filed: Jul. 7, 2009

(65) Prior Publication Data

US 2010/0006896 A1 Jan. 14, 2010

(30) Foreign Application Priority Data

Jul. 14, 2008 (JP) .................................. 2008-182689

(51) Int. Cl.
*H01L 27/118* (2006.01)

(52) U.S. Cl. ........ 257/202; 257/203; 257/204; 257/206; 257/401; 438/128; 438/129; 438/309; 438/587; 438/598

(58) Field of Classification Search .......... 257/202–208; 438/128, 129, 309, 587, 598
See application file for complete search history.

(56) References Cited

U.S. PATENT DOCUMENTS

| | | | | | |
|---|---|---|---|---|---|
| 5,847,421 | A | * | 12/1998 | Yamaguchi | 257/207 |
| 5,892,249 | A | * | 4/1999 | Courtright et al. | 257/209 |
| 6,281,049 | B1 | * | 8/2001 | Lee | 438/129 |
| 6,321,371 | B1 | * | 11/2001 | Yount, Jr. | 716/112 |
| 7,538,368 | B2 | * | 5/2009 | Yano | 257/202 |
| 7,759,182 | B2 | * | 7/2010 | Fleck et al. | 438/183 |
| 7,919,792 | B2 | * | 4/2011 | Law et al. | 257/206 |
| 2002/0033488 | A1 | * | 3/2002 | Kawashima et al. | 257/202 |
| 2005/0001271 | A1 | * | 1/2005 | Kobayashi | 257/368 |
| 2005/0097492 | A1 | * | 5/2005 | Matsumura et al. | 716/10 |
| 2005/0205894 | A1 | * | 9/2005 | Sumikawa et al. | 257/202 |
| 2005/0274983 | A1 | * | 12/2005 | Hayashi et al. | 257/206 |
| 2005/0280031 | A1 | * | 12/2005 | Yano | 257/202 |
| 2007/0004147 | A1 | * | 1/2007 | Toubou et al. | 438/261 |
| 2007/0111405 | A1 | * | 5/2007 | Watanabe et al. | 438/142 |
| 2007/0164317 | A1 | * | 7/2007 | Nakanishi | 257/206 |
| 2007/0267680 | A1 | * | 11/2007 | Uchino et al. | 257/315 |
| 2008/0105904 | A1 | * | 5/2008 | Sumikawa et al. | 257/202 |
| 2008/0224176 | A1 | * | 9/2008 | Nakanishi et al. | 257/202 |
| 2008/0265335 | A1 | * | 10/2008 | Ryu et al. | 257/390 |
| 2009/0020784 | A1 | * | 1/2009 | Araki et al. | 257/207 |
| 2009/0085067 | A1 | * | 4/2009 | Hayashi et al. | 257/202 |
| 2010/0044755 | A1 | * | 2/2010 | Tsuda et al. | 257/206 |
| 2010/0181600 | A1 | * | 7/2010 | Law et al. | 257/204 |
| 2010/0308377 | A1 | * | 12/2010 | Nakanishi et al. | 257/202 |

FOREIGN PATENT DOCUMENTS

| | | |
|---|---|---|
| JP | 2004-288685 | 10/2004 |
| JP | 2005-340461 | 12/2005 |

* cited by examiner

*Primary Examiner* — Eugene Lee
*Assistant Examiner* — Mohammed Shamsuzzaman
(74) *Attorney, Agent, or Firm* — McGinn IP Law Group, PLLC

(57) ABSTRACT

A semiconductor integrated circuit has: a substrate; a basic logic cell placed on the substrate and configured to function as a part of a logic circuit; and a dummy cell placed on the substrate and not configured to function as a part of a logic circuit. The basic logic cell includes a diffusion layer formed in the substrate, and a distance from the diffusion layer to a boundary between the basic logic cell and another cell adjacent to the basic logic cell is equal to a first distance. The dummy cell includes a dummy diffusion layer that is a diffusion layer formed in the substrate, and a distance from the dummy diffusion layer to a boundary between the dummy cell and another cell adjacent to the dummy cell is equal to the first distance.

18 Claims, 7 Drawing Sheets

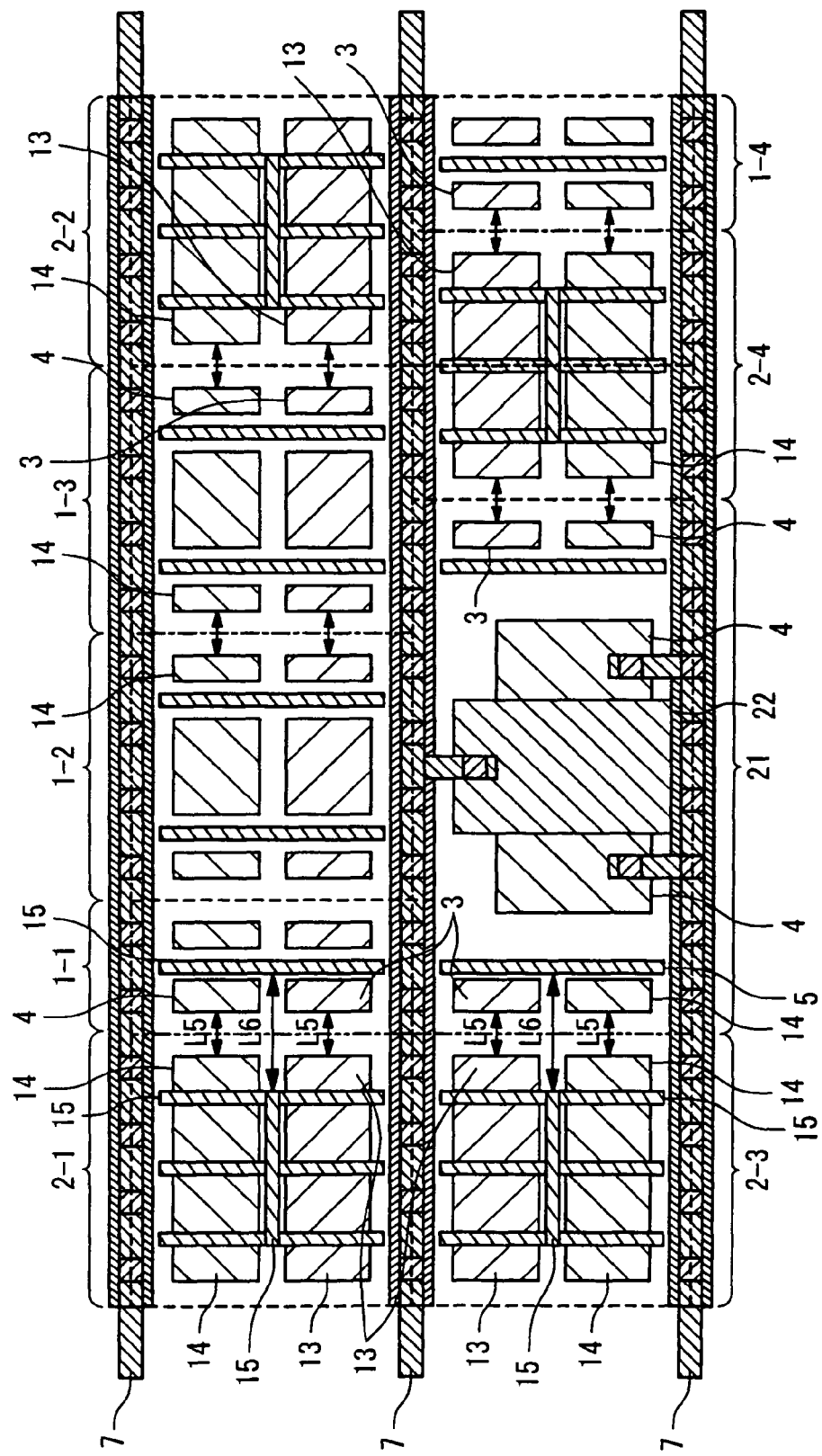

SEMICONDUCTOR INTEGRATED CIRCUIT

INCORPORATION BY REFERENCE

This application is based upon and claims the benefit of priority from Japanese patent application No. 2008-182689, filed on Jul. 14, 2008, the disclosure of which is incorporated herein in its entirety by reference.

BACKGROUND OF THE INVENTION

1. Field of the Invention

The present invention relates to a semiconductor integrated circuit.

2. Description of Related Art

Semiconductor integrated circuits (LSIs) called "semi-custom ICs" such as gate arrays and cell-based ICs (standard cells) have become popular. In the case of the cell-based IC, a desired circuit is achieved by placing basic logic cells such as a two-input NAND, an inverter and a flip-flop on a well (substrate). In the cell-based IC, regions where basic logic cells are placed and regions where no basic logic cell is placed are mixed.

A process for fabricating a semiconductor integrated circuit includes CMP (Chemical Mechanical Polishing). In the CMP, a wafer surface is physically and chemically polished to planarize the wafer surface. However, if regions having different local pattern densities exist on the wafer surface as in the cell-based IC, the wafer surface may not become planar and thus a film thickness of the polished film may not become uniform even after the polishing.

A technique of placing a "dummy cell" is known, the purpose of which is to fill a gap where no basic logic cell is placed and thereby to make local densities of diffusion layers and polysilicon equal.

In general, the cell-based IC is designed by the use of a cell library in which data of the basic logic cells and the dummy cells are stored. In a layout design stage of the cell-based IC, the basic logic cells are placed by using delay data, in-cell layout data and the like stored in the cell library, such that a desired circuit performance is achieved. After the basic logic cells are placed, dummy cells are placed at gaps where no basic logic cell is placed.

The semiconductor integrated circuit such as the cell-based IC includes a large number of logic circuits, and each logic circuit is generally provided with at least one transistor. With increasing miniaturization of the semiconductor integrated circuit, characteristics of the transistor included in the logic circuit are more likely to change depending on a peripheral layout pattern surrounding the logic circuit.

For example, the dummy cell in the cell-based IC often has not only the well but also dummy patterns of diffusion layers and polysilicon for equalizing the local pattern density. Electrical characteristics of a basic logic cell vary depending on a peripheral layout pattern surrounding the basic logic cell and thus may deviate from design values stored in the cell library.

As described above, in the case where layout patterns are greatly different by location within a semiconductor integrated circuit (e.g. when basic logic cells are randomly placed), the characteristics of transistor can vary due to the difference in the layout pattern. In order to suppress the variation of the transistor characteristics, for example, some constraints may be imposed on a placement rule of the basic logic cell, or the variation of the transistor characteristics caused by the peripheral layout pattern may be incorporated as a margin at a time when the library of the basic logic cells is created. However, the above-mentioned techniques for suppressing the variation of the transistor characteristics may cause increase in an area and performance degradation of the semiconductor integrated circuit.

Moreover, in recent years, a ratio of variation in an interconnection width due to the OPE (Optical Proximity Effect) to the original interconnection width is getting larger, which affects the transistor characteristics. Therefore, the OPC (Optical Proximity Correction) is performed with respect to a gate polysilicon of a transistor. In the OPC, the variation due to the OPE is estimated based on a distance between adjacent interconnections and a layout data of an interconnection is corrected such that the interconnection width including the variation due to the OPE becomes equal to its design value. In the case where the dummy cell has not only the well but also the dummy patterns of diffusion layers and polysilicon for equalizing the local pattern density, the peripheral pattern surrounding the basic logic cell becomes complicated. As the peripheral pattern becomes more complicated, the OPC procedure becomes more difficult, which causes increase in TAT (Turn Around Time).

It is important in the semiconductor integrated circuit having the dummy cells to suppress the variation in the electrical characteristics of the basic logic cells that is dependent on the peripheral layout pattern. For example, please refer to Japanese Laid-Open Patent Application JP-2004-288685 (hereinafter referred to as Patent Document 1) and Japanese Laid-Open Patent Application JP-2005-340461 (hereinafter referred to as Patent Document 2).

FIG. 1 is a plan view showing a configuration of a dummy cell 101 in a semiconductor integrated circuit described in the Patent Document 1. As shown in FIG. 1, the dummy cell 101 includes a N well 108, a P well 109, a dummy gate polysilicon 115, a contact 106 and a metal power-supply interconnection 107.

FIG. 2 is a plan view showing a configuration of a semiconductor integrated circuit provided with the dummy cells 101. The semiconductor integrated circuit includes a plurality of basic logic cells 102 that are randomly placed. As shown in FIG. 2, the basic logic cell 102 includes a N+ diffusion layer 103, a P+ diffusion layer 104, a gate polysilicon 105, a contact 106 and a metal power-supply interconnection 107. The dummy cell 101 is so placed as to fill a gap between the basic logic cells 102.

According to the dummy cell technique disclosed in the Patent Document 1, the dummy cell 101 has the dummy gate polysilicon 115 that does not form a transistor. The dummy cells 101 are placed on both sides of the basic logic cell 102, and thereby an inter-gate distance 121 between the gate polysilicon 105 of the basic logic cell 102 and the adjacent dummy gate polysilicon 115 is kept constant. Since the inter-gate distance 121 is kept uniform, a time required for the OPC procedure can be reduced and processing accuracy of the gate polysilicon can be improved.

The Patent Document 2 discloses a technique for suppressing variation in characteristics due to manufacturing variability. According to the technique described in the Patent Document 2, basic cells each consisting of a NMOS transistor and a PMOS transistor are placed in a gate array form in order to suppress variation in characteristics of the basic logic cell (buffer). The gate array is constituted by the basic logic cells and the dummy cells. According to the technique described in the Patent Document 2, the dummy cells are placed in a gate array form around a basic logic cell and thus the gate polysilicon and the diffusion layer around the basic logic cell are placed in a regular manner. Since an inter-polysilicon distance between adjacent gate polysilicons is kept constant, the above-mentioned problems are improved in the basic logic cell (buffer).

The inventor of the present application has recognized the following points. In the case where the dummy cells 101 having the dummy gate polysilicon 115 are placed as shown in FIG. 2, the inter-gate distance 121 between the outermost gate polysilicon 105 of the basic logic cell 102 and the adjacent dummy gate polysilicon 115 can be made constant. However, it is difficult to make a distance (inter-diffusion-layer distance 120) between adjacent diffusion layers of the different basic logic cells 102 constant.

Moreover, the typical semiconductor integrated circuit is provided with an STI (Shallow Trench Isolation) structure in order to electrically isolate transistor elements from each other, namely, to electrically isolate diffusion layers of different transistors from each other. In the case where the STI structure is used, there is difference in Si shrinkage factor between SiO2 of the STI structure and the silicon substrate. Consequently, the Si substrate is subjected to compressive stress (STI stress), which can cause variation in a current characteristic of the transistor. The STI stress varies depending on a size of the STI region namely the distance between adjacent diffusion layers. Therefore, when the inter-diffusion-layer distance 120 varies as shown in FIG. 2, the characteristics of the basic logic cell 102 can vary and deviate from the design values stored in the cell library.

Furthermore, according to the technique described in the Patent Document 2, the dummy cells need to be placed in a gate array form to surround the basic logic cell. This may be applicable when the buffer is placed in a region with low layout density. However, it is difficult to apply to a region where a large number of basic logic cells are placed. Even if it is applied, an area becomes extremely large due to the gate array form. Moreover, the dummy cell does not form a logic but forms a transistor. Therefore, the gate or the diffusion layer may be short-circuited with another region due to malfunction of the dummy cell transistor, fine grains such as dust, and the like, which causes a problem.

SUMMARY

In one embodiment of the present invention, a semiconductor integrated circuit comprises: a substrate; a basic logic cell placed on the substrate and configured to function as a part of a logic circuit; and a dummy cell placed on the substrate and not configured to function as a part of a logic circuit. The basic logic cell includes a diffusion layer formed in the substrate. A distance from the diffusion layer to a boundary between the basic logic cell and another cell adjacent to the basic logic cell is equal to a first distance. Moreover, the dummy cell includes a dummy diffusion layer that is a diffusion layer formed in the substrate. A distance from the dummy diffusion layer to a boundary between the dummy cell and another cell adjacent to the dummy cell is equal to the first distance. As a result, in the semiconductor integrated circuit, a pitch (distance) between the outermost diffusion layers of the basic logic cell and the adjacent cell becomes constant.

In the semiconductor integrated circuit, the basic logic cell may further include a gate electrode, and the dummy cell may further include a dummy gate electrode. A distance from the gate electrode to a boundary between the basic logic cell and another cell adjacent to the basic logic cell is equal to a second distance. In this case, it is preferable that a distance from the dummy gate electrode to a boundary between the dummy cell and another cell adjacent to the dummy cell is equal to the second distance. As a result, a pitch (distance) between the outermost gate polysilicon of the basic logic cell and the adjacent cell becomes constant.

In other words, the distance between the outermost gate polysilicon of the basic logic cell and the adjacent dummy gate polysilicon and the distance between the outermost diffusion layer (N+ diffusion layer, P+ diffusion layer) of the basic logic cell and the adjacent dummy diffusion layer (dummy N+ diffusion layer, dummy P+ diffusion layer) become respectively constant.

According to the present invention, it is possible to suppress variation in characteristics of the basic logic cell that depend on the surrounding layout pattern. Moreover, since it is not necessary to place the dummy cells in a gate array form to surround the basic logic cell, the overhead of the chip area can be suppressed.

Furthermore, it is possible to suppress the variation in the transistor characteristics caused by the peripheral layout pattern, without modifying the arrangement of basic logic cells and the cell library of the basic logic cells. Moreover, it is possible to suppress variation in the gate size and the STI stress at the time of manufacturing.

Furthermore, since the dummy cell (fill cell) does not form a transistor, malfunction caused by defect of a transistor element in the dummy cell does not occur.

BRIEF DESCRIPTION OF THE DRAWINGS

The above and other objects, advantages and features of the present invention will be more apparent from the following description of certain preferred embodiments taken in conjunction with the accompanying drawings, in which:

FIG. 9 is a plan view showing a configuration of a semiconductor integrated circuit according to the fourth embodiment of the present invention.

DESCRIPTION OF PREFERRED EMBODIMENTS

Figure 1:
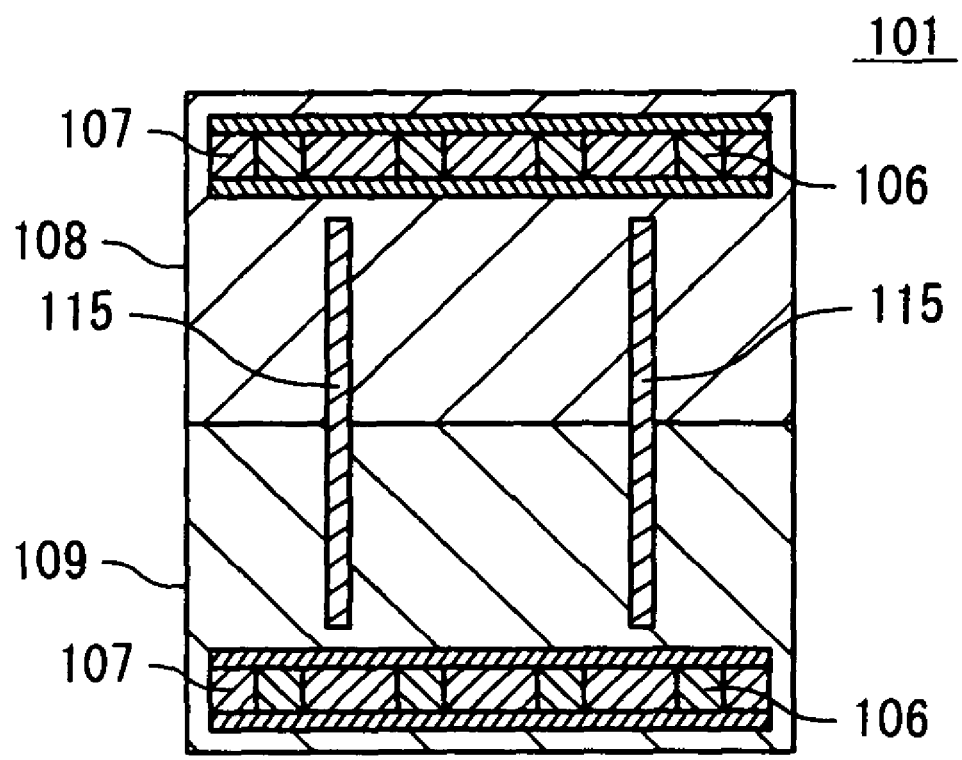
FIG. 1 is a plan view showing a configuration of a typical dummy cell.
Figure 2:
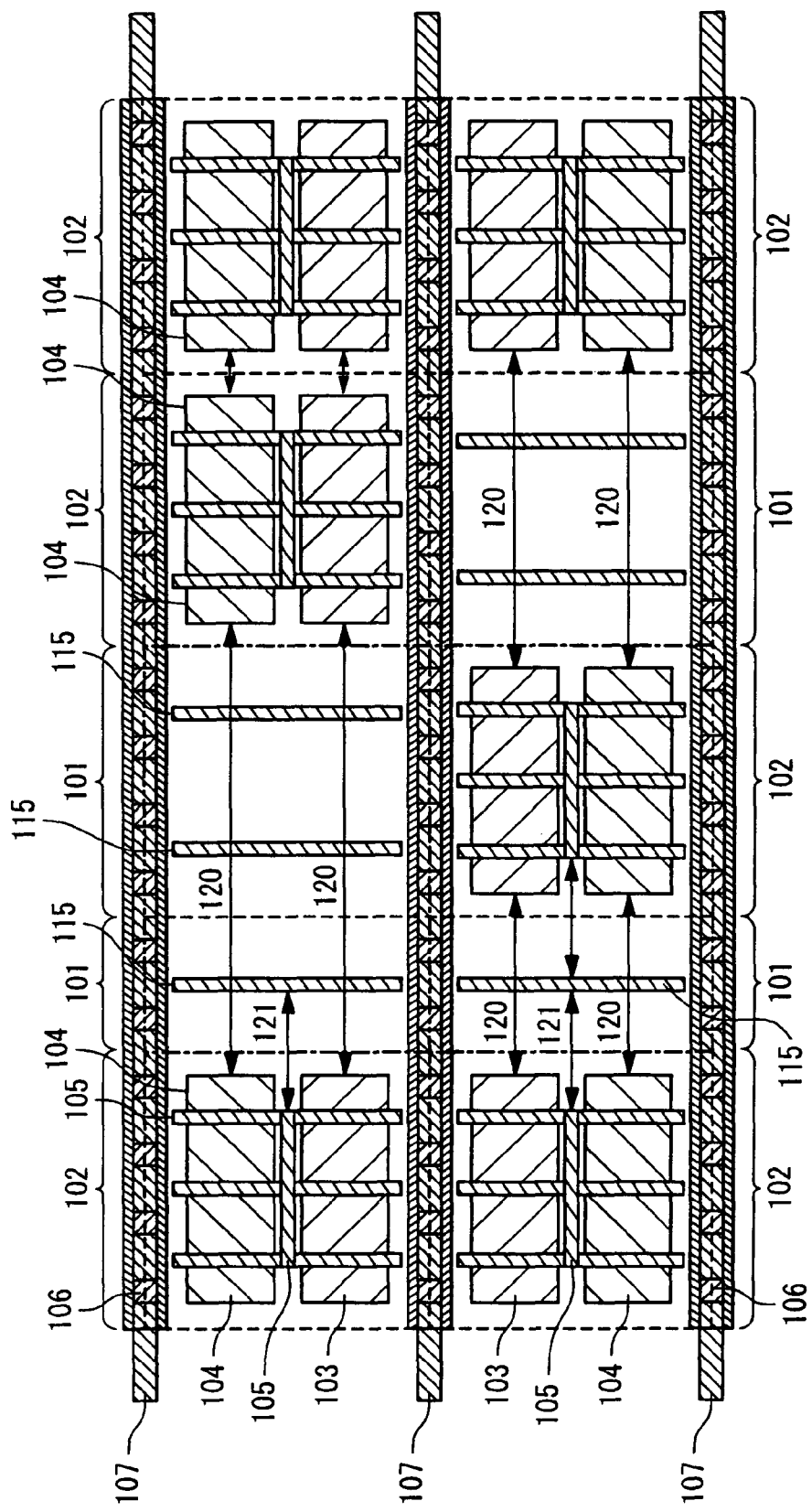
FIG. 2 is a plan view showing a configuration of a semiconductor integrated circuit provided with the typical dummy cell.

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Note that the same reference numerals are given to the same components, and an overlapping description will be omitted as appropriate.

First Embodiment

Figure 3:
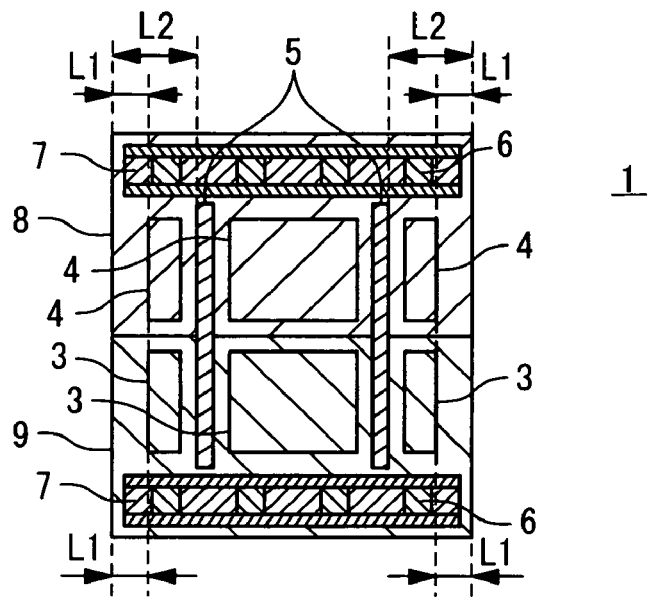
FIG. 3 is a plan view showing a configuration of a dummy cell according to a first embodiment of the present invention.

FIG. 3 is a plan view showing a configuration of a dummy cell 1 according to a first embodiment of the present invention. The dummy cell 1 includes a N well 8 and a P well 9. The N well 8 and the P well 9 are provided between two metal power-supply interconnections 7 connected to contacts 6. The dummy cell 1 further includes a dummy P+ diffusion layer 4 formed in the N well 8 and a dummy N+ diffusion layer 3 formed in the P well 9. The dummy cell 1 further includes a dummy gate polysilicon (dummy gate electrode) 5. The dummy gate polysilicon 5 is formed above the N well 8 and the P well 9. The dummy P+ diffusion layer 4 and the dummy gate polysilicon 5 of the dummy cell 1 are placed so as not to function as a transistor. Similarly, the dummy N+ diffusion layer 3 and the dummy gate polysilicon 5 of the dummy cell 1 are placed so as not to function as a transistor. In other words, the dummy diffusion layer (3, 4) is separated from the dummy gate polysilicon 5, when the dummy gate polysilicon 5 is projected onto the substrate. Specifically, the dummy diffusion layer (3, 4) includes a first side and a second side facing each other, the first side is closer to an edge of the dummy cell 1 than the second side is, and the second side is closer to the dummy gate polysilicon 5 than the first side is. An interval between the second side and the dummy gate polysilicon 5 when the dummy gate polysilicon 5 is projected onto the substrate is so set as to prevent the dummy cell 1 from functioning as a transistor.

The dummy P+ diffusion layer 4 formed in the N well 8 has a side closest to an edge of the dummy cell 1. As shown in FIG. 3, a distance from the closest side to the edge of the dummy cell 1 is designed to be a "first distance L1". Similarly, the dummy N+ diffusion layer 3 formed in the P well 9 has a side closest to an edge of the dummy cell 1, and a distance from the closest side to the edge of the dummy cell 1 is designed to be the "first distance L1". Similarly, the dummy gate polysilicon 5 has a side closest to an edge of the dummy cell 1, and a distance from the closest side to the edge of the dummy cell 1 is designed to be a "second distance L2".

Figure 4:
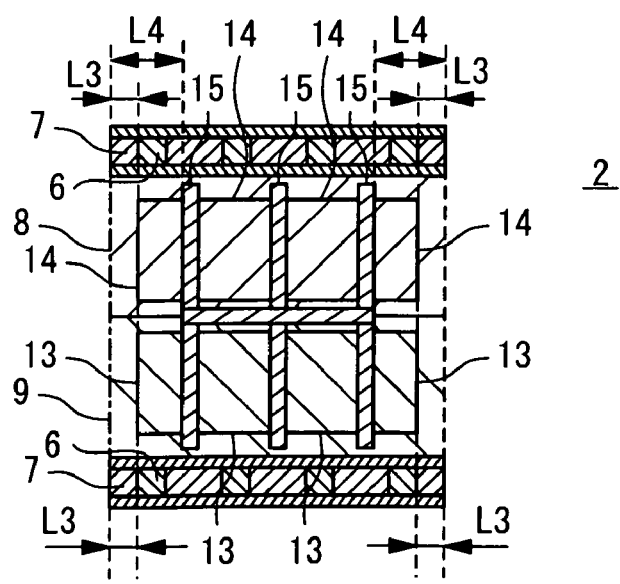
FIG. 4 is a plan view showing a configuration of a basic logic cell according to the first embodiment of the present invention.

FIG. 4 is a plan view showing a configuration of a basic logic cell 2 according to the present embodiment. The basic logic cell 2 includes the N well 8 and the P well 9. The N well 8 and the P well 9 are provided between two metal power-supply interconnections 7 connected to contacts 6. The basic logic cell 2 further includes a P+ diffusion layer 14 formed in the N well 8 and a N+ diffusion layer 13 formed in the P well 9. The basic logic cell 2 further includes a gate polysilicon (gate electrode) 15. The gate polysilicon 15 is formed above the N well 8 and the P well 9. The P+ diffusion layer 14 and the gate polysilicon 15 of the basic logic cell 2 are so placed as to function as a transistor. Similarly, the N+ diffusion layer 13 and the gate polysilicon 15 of the basic logic cell 2 are so placed as to function as a transistor.

The P+ diffusion layer 14 formed in the N well 8 has a side closest to an edge of the basic logic cell 2. As shown in FIG. 4, a distance from the closest side to the edge of the basic logic cell 2 is designed to be a "third distance L3". Similarly, the N+ diffusion layer 13 formed in the P well 9 has a side closest to an edge of the basic logic cell 2, and a distance from the closest side to the edge of the basic logic cell 2 is designed to be the "third distance L3". Similarly, the gate polysilicon 15 has a side closest to an edge of the basic logic cell 2, and a distance from the closest side to the edge of the basic logic cell 2 is designed to be a "fourth distance L4". According to the present embodiment, the above-mentioned first distance L1 is designed to be equal to the third distance L3. Also, the above-mentioned second distance L2 is designed to be equal to the fourth distance L4.

Figure 5:
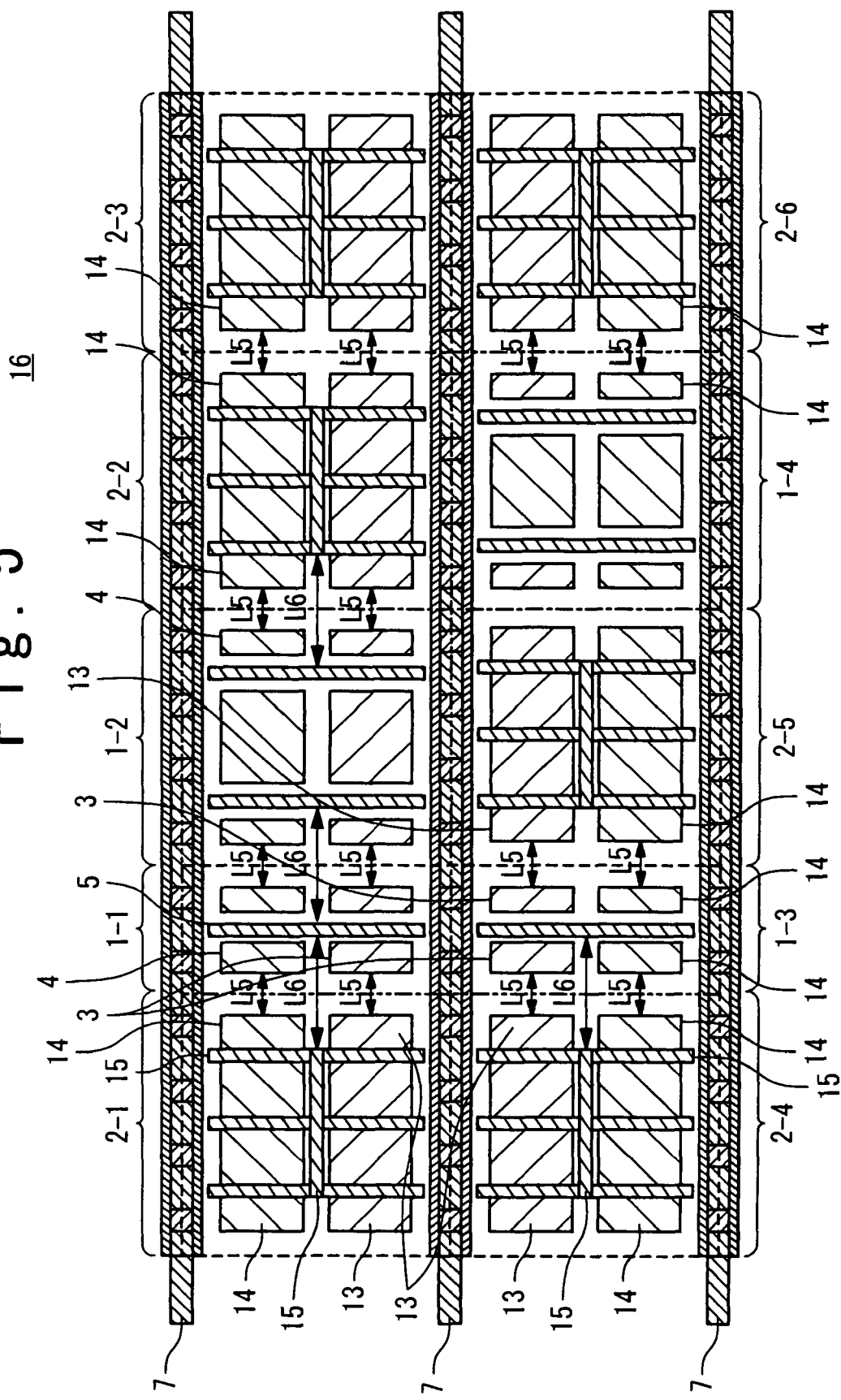
FIG. 5 is a plan view showing a configuration of a semiconductor integrated circuit according to the first embodiment of the present invention.

FIG. 5 is a plan view showing a configuration of a semiconductor integrated circuit 16 according to the present embodiment. The semiconductor integrated circuit 16 includes a plurality of dummy cells 1 and a plurality of basic logic cells 2. In the following description, when the cells need to be distinguished from each other, a number is attached to the reference number through hyphen (e.g. a first basic logic cell 2-1).

As shown in FIG. 5, the semiconductor integrated circuit 16 includes first to fourth dummy cells 1-1 to 1-4 and first to sixth basic logic cells 2-1 to 2-6. In the semiconductor integrated circuit 16 according to the present embodiment, the first dummy cell 1-1 and the second dummy cell 1-2 are placed adjacent to each other, and the first basic logic cell 2-1 and the second basic logic cell 2-2 are placed so as to sandwich the dummy cells 1-1 and 1-2. The third basic logic cell 2-3 is placed adjacent to the second basic logic cell 2-2.

The third dummy cell 1-3 is placed between the fourth basic logic cell 2-4 and the fifth basic logic cell 2-5. The fourth dummy cell 1-4 is placed between the fifth basic logic cell 2-5 and the sixth basic logic cell 2-6.

Here, a reference plane is defined by a plane including a line parallel to the metal power-supply interconnection 7 and being perpendicular to the substrate. In the semiconductor integrated circuit 16, the fourth basic logic cell 2-4 and the first basic logic cell 2-1 are placed symmetrically with respect to the reference plane. The third dummy cell 1-3 and the first dummy cell 1-1 are placed symmetrically with respect to the reference plane. The third basic logic cell 2-3 and the sixth basic logic cell 2-6 are placed symmetrically with respect to the reference plane.

Moreover, the second dummy cell 1-2 and the fifth basic logic cell 2-5 are placed such that the respective wells (N well 8, P well 9) are symmetric with respect to the reference plane. In accordance with the wells, the dummy N+ diffusion layer 3 and the N+ diffusion layer 13 are placed symmetrically with respect to the reference plane. Similarly, in accordance with the wells, the dummy P+ diffusion layer 4 and the P+ diffusion layer 14 are placed symmetrically with respect to the reference plane. Moreover, the second basic logic cell 2-2 and the fourth dummy cell 1-4 are placed such that the respective wells (N well 8, P well 9) are symmetric with respect to the reference plane. In accordance with the wells, the dummy N+ diffusion layer 3 and the N+ diffusion layer 13 are placed symmetrically with respect to the reference plane, and the dummy P+ diffusion layer 4 and the P+ diffusion layer 14 are placed symmetrically with respect to the reference plane.

Referring to FIG. 5, let us consider two cells placed adjacent to each other. When a dummy cell 1 and a basic logic cell 2 are placed adjacent to each other, a distance between the respective diffusion layers or a distance between the respective gate electrodes is always constant. Also, when two dummy cells 1 are placed adjacent to each other, a distance between the respective diffusion layers or a distance between the respective gate electrodes is always constant. Moreover, when two basic logic cells 2 are placed adjacent to each other, a distance between the respective diffusion layers or a distance between the respective gate electrodes is always constant.

For example, in the semiconductor integrated circuit 16, a distance between the outermost P+ diffusion layer 14 of the first basic logic cell 2-1 and the outermost dummy P+ diffusion layer 4 of the first dummy cell 1-1 is an "inter-diffusion-layer distance L5". Similarly, a distance between the outermost N+ diffusion layer 13 of the first basic logic cell 2-1 and the outermost dummy N+ diffusion layer 3 of the first dummy cell 1-1 is equal to the inter-diffusion-layer distance L5. Moreover, a distance between the outermost gate polysilicon 15 of the first basic logic cell 2-1 and the outermost dummy gate polysilicon 5 of the first dummy cell 1-1 is an "inter-electrode distance L6".

In the semiconductor integrated circuit 16, a distance between the outermost dummy P+ diffusion layer 4 of the first dummy cell 1-1 and the outermost dummy P+ diffusion layer 4 of the second dummy cell 1-2 is equal to the inter-diffusion-layer distance L5. Similarly, a distance between the outermost dummy N+ diffusion layer 3 of the first dummy cell 1-1 and the outermost dummy N+ diffusion layer 3 of the second dummy cell 1-2 is equal to the inter-diffusion-layer distance L5. Moreover, a distance between the outermost dummy gate polysilicon 5 of the first dummy cell 1-1 and the outermost dummy gate polysilicon 5 of the second dummy cell 1-2 is equal to the inter-electrode distance L6.

In the semiconductor integrated circuit 16, a distance between the outermost P+ diffusion layer 14 of the second basic logic cell 2-2 and the outermost P+ diffusion layer 14 of the third basic logic cell 2-3 is equal to the inter-diffusion-layer distance L5. Similarly, a distance between the outermost N+ diffusion layer 13 of the second basic logic cell 2-2 and the outermost N+ diffusion layer 13 of the third basic logic cell 2-3 is equal to the inter-diffusion-layer distance L5. Moreover, a distance between the outermost gate polysilicon 15 of the second basic logic cell 2-2 and the outermost gate polysilicon 15 of the third basic logic cell 2-3 is equal to the inter-electrode distance L6.

As described above, a distance from the outermost dummy P+ diffusion layer 4 of the dummy cell 1 to the closest edge of the dummy cell 1 (i.e. a boundary between the dummy cell 1 and the adjacent cell) is designed to be the first distance L1. Also, a distance from the outermost P+ diffusion layer 14 of the basic logic cell 2 to the closest edge of the basic logic cell 2 (i.e. a boundary between the basic logic cell 2 and the adjacent cell) is designed to be the third distance L3. Furthermore, the first distance L1 and the third distance L3 are equal to each other. Therefore, the inter-diffusion-layer distance L5 (the distance between the diffusion layers of the adjacent cells) can be expressed as follows.

$$\text{Inter-diffusion-layer distance } L5 = \text{first distance } L1 + \text{third distance } L3$$
$$= \text{first distance } L1 + \text{first distance } L1$$
$$= \text{third distance } L3 + \text{third distance } L3$$

Moreover, a distance from the outermost dummy gate polysilicon 5 of the dummy cell 1 to the closest edge of the dummy cell 1 (i.e. a boundary between the dummy cell 1 and the adjacent cell) is designed to be the second distance L2. Also, a distance from the outermost gate polysilicon 15 of the basic logic cell 2 to the closest edge of the basic logic cell 2 (i.e. a boundary between the basic logic cell 2 and the adjacent cell) is designed to be the fourth distance L4. Furthermore, the second distance L2 and the fourth distance L4 are equal to each other. Therefore, the inter-electrode distance L6 (the distance between the gate electrodes of the adjacent cells) can be expressed as follows.

$$\text{Inter-electrode distance } L6 = \text{second distance } L2 + \text{fourth distance } L4$$
$$= \text{second distance } L2 + \text{second distance } L2$$
$$= \text{fourth distance } L4 + \text{fourth distance } L4$$

According to the semiconductor integrated circuit 16 in the present embodiment, the inter-diffusion-layer distance L5 and the inter-electrode distance L6 with regard to the adjacent cells are always constant regardless of the cell arrangement.

According to the semiconductor integrated circuit 16 in the present embodiment, the variation in the transistor characteristics due to gate length variation and STI stress variation that are dependent on the peripheral layout pattern is suppressed by using the dummy cell 1 having no logical function. Consequently, it is not necessary to add extra margin to delay/power characteristics of the basic logic cell 2 stored in the cell library. Also, it is not necessary to add extra layout pattern to the basic logic cell 2. Moreover, it is not necessary to place dummy cells 1 in a gate array form, and thus the variation in the transistor characteristics can be suppressed without area overhead.

Second Embodiment

Figure 6:
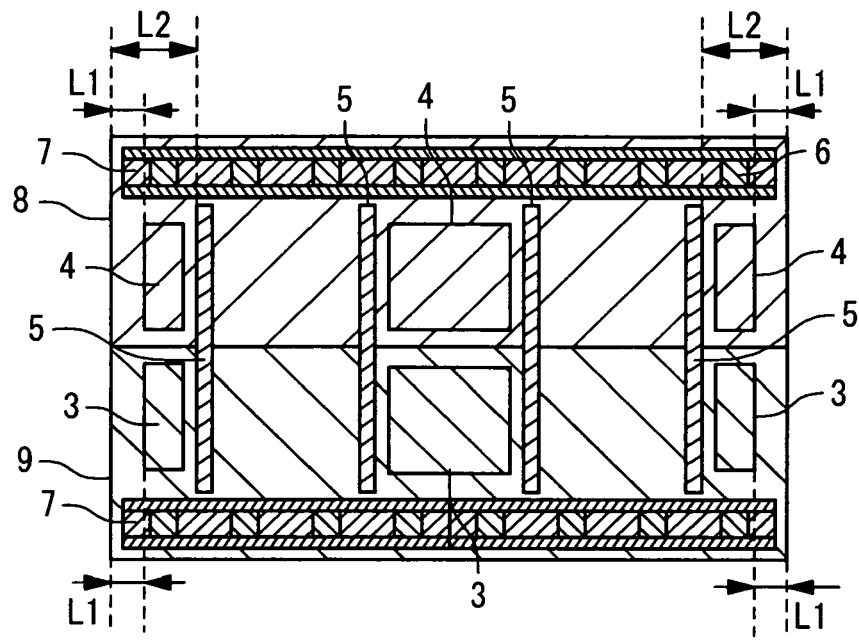
FIG. 6 is a plan view showing a configuration of a dummy cell according to a second embodiment of the present invention.

FIG. 6 is a plan view showing a configuration of a dummy cell 1 according to a second embodiment of the present invention. In general, several kinds of sizes are prepared for the dummy cell 1. In a case of a large-size dummy cell 1, it is preferable to uniformly provide dummy gate polysilicons 5 and diffusion layers within the cell in addition to the outermost dummy gate polysilicon 5 and the outermost diffusion layer, for the purpose of data uniformity and manufacturability.

As shown in FIG. 6, the dummy cell 1 in the second embodiment is provided with four dummy gate polysilicons 5 and the outermost diffusion layers (dummy N+ diffusion layers 3, dummy P+ diffusion layers 4). The dummy cell 1 in the second embodiment is further provided with one extra dummy N+ diffusion layer 3 and one extra dummy P+ diffusion layer 4 that are sandwiched between the inner two dummy gate polysilicons 5.

According to the dummy cell 1 of the second embodiment, the distance relationship is the same as in the first embodiment. That is, the outermost dummy P+ diffusion layer 4 formed in the N well 8 has a side closest to an edge of the dummy cell 1, and a distance from the closest side to the edge of the dummy cell 1 is equal to the first distance L1. Similarly, the outermost dummy N+ diffusion layer 3 formed in the P well 9 has a side closest to an edge of the dummy cell 1, and a distance from the closest side to the edge of the dummy cell 1 is equal to the first distance L1. Similarly, the outermost dummy gate polysilicon 5 has a side closest to an edge of the dummy cell 1, and a distance from the closest side to the edge of the dummy cell 1 is equal to the second distance L2.

Third Embodiment

Figure 7:
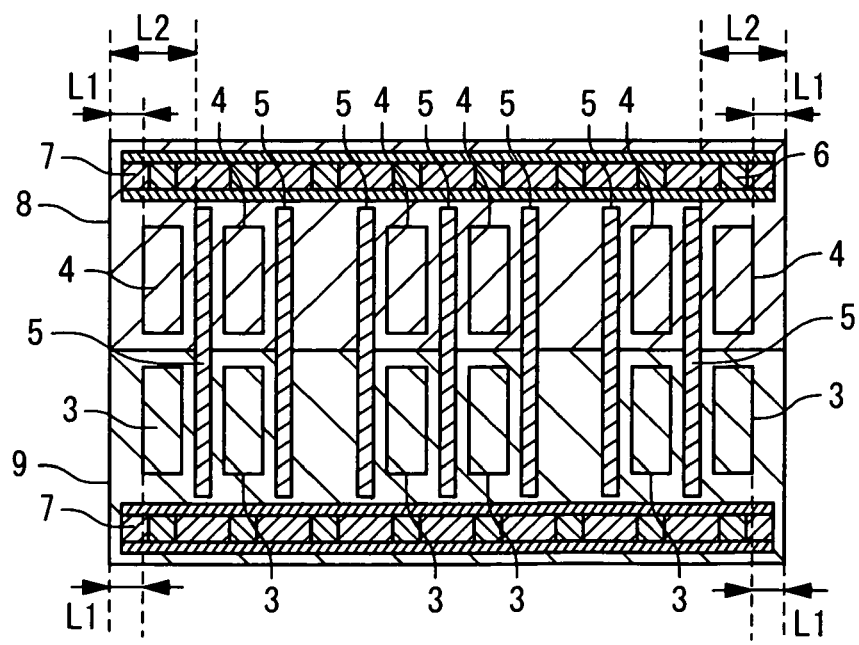
FIG. 7 is a plan view showing a configuration of a dummy cell according to a third embodiment of the present invention.

FIG. 7 is a plan view showing a configuration of a dummy cell 1 according to a third embodiment of the present invention. As shown in FIG. 7, the dummy cell 1 in the third embodiment is provided with seven dummy gate polysilicons 5 and the outermost diffusion layers (dummy N+ diffusion layers 3, dummy P+ diffusion layers 4). The dummy cell 1 in the third embodiment is further provided with extra dummy N+ diffusion layers 3 and extra dummy P+ diffusion layers 4 that are located between the inner three dummy gate polysilicons 5.

According to the dummy cell 1 of the third embodiment, the distance relationship is the same as in the first embodiment and the second embodiment. That is, the outermost dummy P+ diffusion layer 4 formed in the N well 8 has a side closest to an edge of the dummy cell 1, and a distance from the closest side to the edge of the dummy cell 1 is equal to the first distance L1. Similarly, the outermost dummy N+ diffusion layer 3 formed in the P well 9 has a side closest to an edge of the dummy cell 1, and a distance from the closest side to the edge of the dummy cell 1 is equal to the first distance L1. Similarly, the outermost dummy gate polysilicon 5 has a side closest to an edge of the dummy cell 1, and a distance from the closest side to the edge of the dummy cell 1 is equal to the second distance L2.

Regarding the dummy gate polysilicon 5 and the diffusion layer within the dummy cell 1, various arrangements other than the above-described first to third embodiments are also possible. The arrangement can be determined depending on the design rule of the process.

Fourth Embodiment

Figure 8:
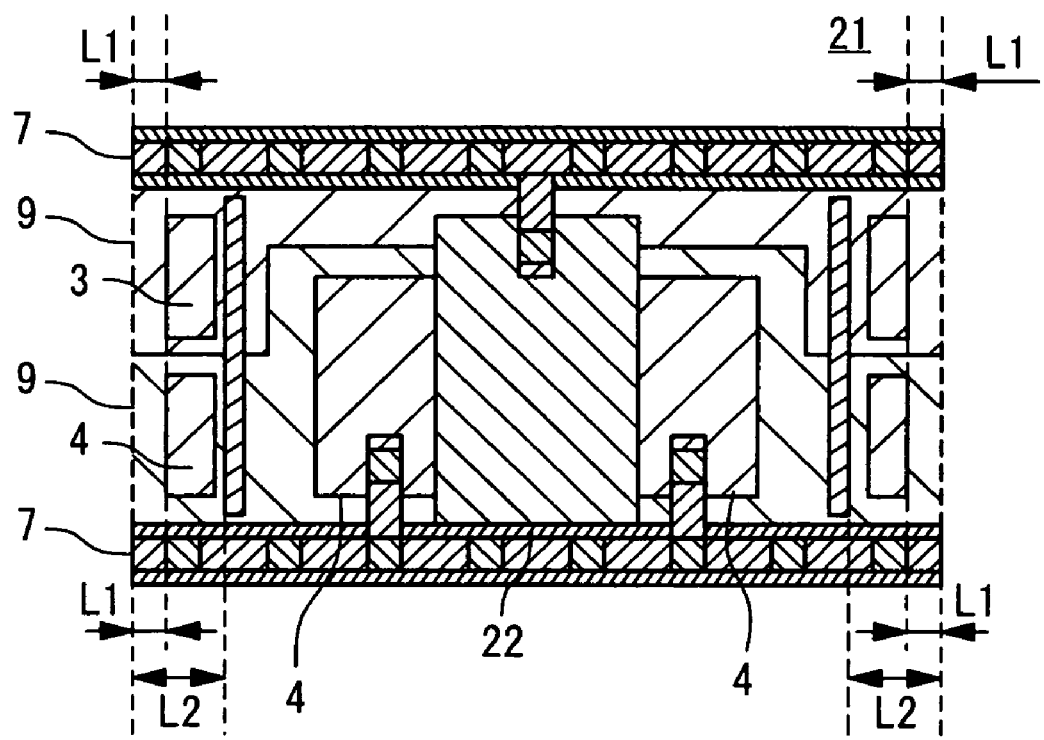
FIG. 8 is a plan view showing a configuration of a dummy cell according to a fourth embodiment of the present invention.

FIG. 8 is a plan view showing a configuration of a decoupling dummy cell 21 according to a fourth embodiment of the present invention. The decoupling dummy cell 21 in the fourth embodiment is a dummy cell 1 configured to have a decoupling capacitor. The decoupling dummy cell 21 (dummy cell 1 with decoupling capacitor) is preferably placed for suppressing dynamic IR drop. In general, a gate capacitor of a transistor is used for suppressing the dynamic IR drop. As shown in FIG. 8, the decoupling dummy cell 21 is configured to be a decoupling cell using a PMOS gate capacitor. A gate electrode 22 of the PMOS transistor of the decoupling dummy cell 21 is connected to the ground line. A source, a drain and a back gate terminal of the PMOS transistor of the decoupling dummy cell 21 are connected to the power supply line. Consequently, the decoupling dummy cell 21 achieves a function of the gate capacitor.

FIG. 9 is a plan view showing a configuration of a semiconductor integrated circuit 16 provided with the decoupling dummy cell 21. As in the case of the foregoing embodiments, a distance between the outermost gate polysilicon 15 of the basic logic cell 2 and the adjacent dummy gate polysilicon 5 is equal to the inter-electrode distance L6, which is constant. Moreover, a distance between the outermost diffusion layer (N+ diffusion layer 13, P+ diffusion layer 14) of the basic logic cell 2 and the adjacent diffusion layer (dummy N+ diffusion layer 3, dummy P+ diffusion layer 4) is equal to the inter-diffusion-layer distance L5, which is constant. Consequently, the variation in characteristics of the basic logic cell 2 that is dependent on the peripheral layout pattern can be suppresses.

It is apparent that the present invention is not limited to the above embodiments and may be modified and changed without departing from the scope and spirit of the invention.

What is claimed is:

1. A semiconductor integrated circuit, comprising:
a substrate;
a basic logic cell placed on said substrate and configured to function as a part of a logic circuit; and
a dummy cell placed on said substrate and configured to function other than as a part of a logic circuit,
wherein said basic logic cell includes a diffusion layer formed in said substrate, and a distance from said diffusion layer to a boundary between said basic logic cell and another cell, similar to said basic logic cell that includes the diffusion layer, located adjacent to said basic logic cell is equal to a first distance,
wherein said dummy cell includes a dummy diffusion layer that comprises a diffusion layer formed in said substrate, and a distance from said dummy diffusion layer to a boundary between said dummy cell and said another cell, which is located adjacent to said dummy cell, is equal to said first distance,
wherein said basic logic cell further includes a gate electrode, and a distance from said gate electrode to the boundary between said basic logic cell and another cell adjacent to said basic logic cell is equal to a second distance, and
wherein said dummy cell further includes a dummy gate electrode, and a distance from said dummy gate electrode to the boundary between said dummy cell and said another cell, which is located adjacent to said dummy cell, is equal to said second distance.

2. The semiconductor integrated circuit according to claim 1, wherein said dummy cell further includes a decoupling capacitor.

3. The semiconductor integrated circuit according to claim 1, wherein said dummy diffusion layer includes a first side and a second side,
wherein said first side is closer than said second side to an edge of said dummy cell, and said second side is closer than said first side to said dummy gate electrode, and
wherein an interval between said second side and said dummy gate electrode when said dummy gate electrode is projected onto said substrate is set to prevent said dummy cell from functioning as a transistor.

4. The semiconductor integrated circuit according to claim 1, wherein said dummy cell is placed between said basic logic cell and another basic logic cell, and said dummy diffusion layer includes a first dummy diffusion layer and a second dummy diffusion layer,
wherein said first dummy diffusion layer is closer than said second dummy diffusion layer to said basic logic cell, and said second dummy diffusion layer is closer than said first dummy diffusion layer to said another basic logic cell, and
wherein a distance between said first dummy diffusion layer and an edge of said basic logic cell is equal to said first distance, and a distance between said second dummy diffusion layer and an edge of said another basic logic cell is equal to said first distance.

5. The semiconductor integrated circuit according to claim 1, wherein the semiconductor integrated circuit comprises a plurality of ones of the dummy cell.

6. The semiconductor integrated circuit according to claim 1, further comprising a plurality of metal power-supply interconnections, the dummy cell and the basic logic cell being provided between the plurality of metal power-supply interconnections.

7. The semiconductor integrated circuit according to claim 1, wherein the dummy cell comprises an N well and a P well that abuts the N well.

8. The semiconductor integrated circuit according to claim 7, wherein the dummy gate electrode is disposed above the N well and the P well.

9. The semiconductor integrated circuit according to claim 1,
wherein an interval between a side of said dummy diffusion layer and said dummy gate electrode is set to prevent said dummy cell from functioning as a transistor.

10. The semiconductor integrated circuit according to claim 1, wherein the semiconductor integrated circuit comprises a plurality of ones of the dummy cell comprising a first dummy cell and a second dummy cell, and a plurality of ones of the basic logic cell comprising a first basic logic cell and a second basic logic cell, and wherein the first dummy cell and the second dummy cell are placed adjacent to each other, and the first basic logic cell and the second basic logic cell are placed to sandwich the first and the second dummy cells.

11. The semiconductor integrated circuit according to claim 10, wherein a third basic logic cell of said plurality of ones of the basic logic cell is placed adjacent to the second basic logic cell.

12. The semiconductor integrated circuit according to claim 11, wherein a third dummy cell of said plurality of ones of the dummy cell is placed between a fourth basic logic cell of said plurality of ones of the basic logic cell, and a fifth basic logic cell of said plurality of ones of the basic logic cell, and wherein, a fourth dummy cell of said plurality of ones of the dummy cell is placed between the fifth basic logic cell and a sixth basic logic cell of said plurality of ones of the basic logic cell.

13. The semiconductor integrated circuit according to claim 12, wherein a reference plane is defined by a plane including a line perpendicular to the substrate, wherein the fourth basic logic cell and the first basic logic cell are placed symmetrically with respect to the reference plane, wherein the third dummy cell and the first dummy cell are placed symmetrically with respect to the reference plane, and wherein the third basic logic cell and the sixth basic logic cell are placed symmetrically with respect to the reference plane.

14. A semiconductor integrated circuit, comprising:
a substrate;
a basic logic cell placed on said substrate and configured to function as a part of a logic circuit; and
a dummy cell placed on said substrate and configured to function other than as a part of any logic circuit, wherein said basic logic cell includes a diffusion layer formed in said substrate and a gate electrode, a distance from said gate electrode to a boundary between said basic logic cell and another cell, similar to said basic logic cell that includes the diffusion layer, located adjacent to said basic logic cell being equal to a predetermined distance, and wherein said dummy cell includes a dummy diffusion layer and a dummy gate electrode, a distance from said dummy gate electrode to a boundary between said dummy cell and another cell adjacent to said dummy cell is equal to said predetermined distance.

15. The semiconductor integrated circuit according to claim 14, wherein a distance from said diffusion layer to the boundary between said basic logic cell and said another cell adjacent to said basic logic cell is equal to another predetermined distance, and wherein a distance from said dummy diffusion layer to the boundary between said dummy cell and another cell adjacent to said dummy cell is equal to said another predetermined distance.

16. The semiconductor integrated circuit according to claim 14, wherein the semiconductor integrated circuit comprises a plurality of ones of the dummy cell.

17. The semiconductor integrated circuit according to claim 14, wherein the semiconductor integrated circuit comprises a plurality of ones of the dummy cell comprising a first dummy cell and a second dummy cell, and a plurality of ones of the basic logic cell comprising a first basic logic cell and a second basic logic cell, and wherein the first dummy cell and the second dummy cell are placed adjacent to each other, and the first basic logic cell and the second basic logic cell are placed to sandwich the first and the second dummy cells.

18. The semiconductor integrated circuit according to claim 14, further comprising a plurality of metal power-supply interconnections, the dummy cell and the basic logic cell being provided between the plurality of metal power-supply interconnections.

* * * * *